(12) United States Patent
Cai et al.

(10) Patent No.: US 12,106,802 B2
(45) Date of Patent: Oct. 1, 2024

(54) STORAGE ARRAY HAVING HALF SCHMITT INVERTER

(71) Applicant: HUAWEI TECHNOLOGIES CO., LTD., Guangdong (CN)

(72) Inventors: Jiangzheng Cai, Shanghai (CN); Mingen Bu, Shanghai (CN); Yuzheng Jin, Shenzhen (CN); Yuqing Zhang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 164 days.

(21) Appl. No.: 18/048,854

(22) Filed: Oct. 23, 2022

(65) Prior Publication Data

US 2023/0054139 A1    Feb. 23, 2023

Related U.S. Application Data

(63) Continuation of application No. PCT/CN2020/086280, filed on Apr. 23, 2020.

(51) Int. Cl.
G11C 11/419    (2006.01)
G11C 11/412    (2006.01)

(52) U.S. Cl.
CPC .......... *G11C 11/419* (2013.01); *G11C 11/412* (2013.01)

(58) Field of Classification Search
CPC .............................................. G11C 11/41–419
See application file for complete search history.

(56) References Cited

U.S. PATENT DOCUMENTS

| 5,420,813 | A   |   | 5/1995  | Nii |                        |
|-----------|-----|---|---------|-----|------------------------|
| 8,837,207 | B1  | * | 9/2014  | Jou | .......... G11C 11/412 |
|           |     |   |         |     | 365/189.11             |
| 2015/0279453 | A1 | * | 10/2015 | Fujiwara | ........... G11C 11/419 |
|           |     |   |         |     | 365/154                |
| 2016/0225437 | A1 | * | 8/2016 | Kumar | ................ G11C 8/16 |

FOREIGN PATENT DOCUMENTS

CN        103700395 A       4/2014

* cited by examiner

*Primary Examiner* — Alfredo Bermudez Lozada
(74) *Attorney, Agent, or Firm* — HUAWEI TECHNOLOGIES CO., LTD.

(57) ABSTRACT

A storage array includes a read bit line, a ground, a read bit line switch of the read bit line, and a plurality of storage circuits. Each storage circuit includes a storage unit configured to store data and a read circuit configured to read data from the storage unit. A data input end of the read circuit is connected to a data output end of the storage unit, to read data from the storage circuit, and a data output end of the read circuit is connected to the read bit line, to output the read data to the read bit line. There is at least one PMOS transistor in an electric leakage path from a power supply to the read bit line in the read circuit, to suppress a leakage current in the read circuit.

17 Claims, 8 Drawing Sheets

STORAGE ARRAY HAVING HALF SCHMITT INVERTER

CROSS-REFERENCE TO RELATED APPLICATIONS

This application is a continuation of International Application No. PCT/CN2020/086280, filed on Apr. 23, 2020, the disclosure of which is hereby incorporated by reference in its entirety.

TECHNICAL FIELD

This application relates to a storage circuit, and in particular, to a storage array at a low leakage current.

BACKGROUND

In the chip design field, power consumption has gradually become a core technical specification. In a SOC (system on chip,), compared with a logic circuit, a static random-access memory (SRAM) occupies an increasing area in a chip, and also causes an increasingly serious electric leakage phenomenon.

FIG. 1 is a schematic diagram of a structure of a SRAM in the conventional technology. The SRAM includes a read bit line RBL (read bit line), a read bit line switch P0, and N storage units mounted onto the read bit line: a storage unit 0, a storage unit 1, ..., and a storage unit N-1. Each storage unit is electrically connected to the read bit line RBL by using a MOS transistor N0 and a MOS transistor N1 that correspond to the storage unit. The MOS transistor N0 and the MOS transistor N1 are cascaded between the read bit line RBL and a ground VSS. A data output end QB of the storage unit is electrically connected to a gate of the MOS transistor N1, and a read word line RWL (read word line) is electrically connected to a gate of the MOS transistor N0. When data is read, the read bit line switch P0 is open, and the read word line RWL selects a storage unit that needs to be read. For example, when the storage unit 0 is read, a read word line corresponding to the storage unit 0 is RWL<0>=1, a MOS transistor N0 corresponding to the storage unit is closed, and read word lines corresponding to other storage units are RWL=0. When the data output end QB of the storage unit is 0, N1 is open, and the RBL keeps at a high level. When QB is 1, both N1 and N2 are closed, and the RBL is pulled down to a low level. A level on the RBL represents data in a read storage unit.

The MOS transistor N0 and the MOS transistor N1 may produce an additional electric leakage path, namely, a path from the RBL, the MOS transistor N0, and the MOS transistor N1 to the VSS. The electric leakage path increases static power consumption of the SRAM. In addition, a quantity of mounted storage units is limited due to electric leakage of the SRAM. When data in a storage unit is opposite to data in other storage units, the RBL may not keep at a high level due to leakage currents of the other storage units, causing a data read error.

SUMMARY

Embodiments of this application provide a storage array at a low leakage current, to effectively suppress a leakage current of the storage array, thereby improving a case in which a data read error is caused in the storage array due to the leakage current.

For convenient description, in the embodiments of this application, one electrode of a drain or a source of a MOS transistor is referred to as a first end, and correspondingly, the other electrode is referred to as a second end. For example, for a MOS transistor M1, if a first end of M1 is a drain, a second end of M1 is a source; or if a first end of M1 is a source, a second end of M1 is a drain. In addition, in the embodiments of this application, any type of MOS transistor, such as a P-channel metal oxide semiconductor (PMOS) transistor or an N-channel metal oxide semiconductor (NMOS) transistor, is described by using a MOS transistor M0, a MOS transistor M1, a MOS transistor M2, or the like. In the embodiments of this application, different NMOS transistors in a same circuit are described by using a MOS transistor N1, a MOS transistor N2, a MOS transistor N3, and the like, and different PMOS transistors in a same circuit are described by using a MOS transistor P1, a MOS transistor P2, a MOS transistor P3, and the like.

According to a first aspect, an embodiment of this application provides a storage array, including a read bit line, a read bit line switch, and a plurality of storage circuits, where the read bit line switch is connected between a ground and the read bit line. The read bit line switch is open when data is read, so that a level on the read bit line can indicate a level of the read data; and the read bit line switch is closed when no data is read, so that the read bit line always keeps at a low level. Each storage circuit includes a storage unit configured to store data and a read circuit configured to read data. A data input end of the read circuit is electrically connected to a data output end of the storage unit, and a data output end of the read circuit is electrically connected to the read bit line. The read circuit is further connected to a power supply, and the read circuit has an electric leakage path. A direction of the electric leakage path is from the power supply to the read bit line through the read circuit. There is at least one PMOS transistor in the electric leakage path, to suppress a leakage current in the read circuit. Usually, all the storage circuits have a same circuit structure, to reduce circuit design and process manufacturing difficulty. Each storage unit is configured to store 1-bit data, for example, a high level may represent 1, and a low level may represent 0.

When the electric leakage path in the read circuit has a relatively high leakage current, and data in a storage unit is opposite to data in other storage units, the read bit line cannot keep at a correct level due to leakage currents of the other storage units, causing a data read error. In the storage array provided in this embodiment of this application, because there is the at least one PMOS transistor in the electric leakage path, and the PMOS transistor has a lower leakage current than an NMOS transistor, a leakage current can be effectively suppressed, so that the read bit line can still keep at a correct level when the other storage units have leakage currents, thereby causing no impact on correct data reading. In addition, a lower leakage current enables more storage units to be mounted onto the read bit line in the storage array, thereby improving storage density of the storage array and reducing area overheads.

In a possible implementation, each storage circuit further includes a read word line corresponding to the storage circuit, and the read circuit includes a MOS transistor M1 and a MOS transistor M2 that are cascaded between the read bit line and the power supply. A gate (a control end) of the MOS transistor M1 is the data input end of the read circuit, and the MOS transistor M1 may be open or closed based on read data. A gate of the MOS transistor M2 is electrically connected to the read word line, to accept control of the read word line to close or open the MOS transistor M2. For a storage circuit that does not need to be read, a word line corresponding to the storage circuit controls a MOS transistor M2 to be open. A first end of the MOS transistor M2 is the output end of the read circuit, a second end of the MOS transistor M2 is electrically connected to a first end of the MOS transistor M1, and a second end of the MOS transistor M1 is electrically connected to the power supply. The MOS transistor M1 and the MOS transistor M2 include at least one PMOS transistor. In the storage circuit, the MOS transistor M1 is electrically connected to the power supply, to change an original electric leakage path to the power supply→the MOS transistor M1→the MOS transistor M2→the read bit line. Therefore, a leakage current can be better suppressed when data of a to-be-read storage unit is 1 and data of other storage units is 0.

In a possible implementation, the read bit line switch is an NMOS transistor. Compared with a read bit line switch of a PMOS transistor, the NMOS transistor has a lower conduction voltage drop than the PMOS transistor, and therefore is more controllable.

In a possible implementation, the MOS transistor M1 is a PMOS transistor, and the MOS transistor M2 is an NMOS transistor; or the MOS transistor M2 is a PMOS transistor, and the MOS transistor M1 is an NMOS transistor. One of the MOS transistor M1 and the MOS transistor M2 is kept as a PMOS transistor, so that a leakage current can be reduced.

In a possible implementation, both the MOS transistor M1 and the MOS transistor M2 are PMOS transistors. When both the MOS transistors are PMOS transistors, a leakage current can be more effectively reduced.

In a possible implementation, before data is read, the read bit line switch is closed based on a received control signal, so that the read bit line can be electrically connected to the ground to keep at a low level. When data is read, the read bit line switch is open, and the MOS transistor M1 is closed or open based on data read from the storage unit. For example, when the MOS transistor M1 is a PMOS transistor, the MOS transistor M1 is closed when 0 is read from the storage unit. The MOS transistor M2 is closed and open based on control of the read word line. The read word line may choose to close a MOS transistor M2 in a storage circuit that needs to read data, and to open a MOS transistor M2 in a storage circuit that does not need to read data. The foregoing connection manner enables data in each storage unit to be read by controlling opening or closing of a MOS transistor in a read circuit.

In a possible implementation, the storage unit includes a MOS transistor P1 and a MOS transistor N1 that are cascaded between the power supply and the ground, a MOS transistor P2 and a MOS transistor N2 that are cascaded between the power supply and the ground, a MOS transistor N3, and a MOS transistor N4. A first end of the MOS transistor P1 and a first end of the MOS transistor N1 are electrically connected to a Q node, and a first end of the MOS transistor P2 and a first end of the MOS transistor N2 are electrically connected to a QB node. Second ends of the MOS transistor P1 and the MOS transistor P2 are separately electrically connected to the power supply, and second ends of the MOS transistor N1 and the MOS transistor N2 are separately electrically connected to the ground. The QB node is the data output end of the storage unit, and the QB node is a phase-inverted node of the Q node. A first end of the MOS transistor N3 is electrically connected to the QB node, a second end of the MOS transistor N3 is electrically connected to a write bit line, and a gate of the MOS transistor N3 is electrically connected to a write word line. A first end of the MOS transistor N4 is electrically connected to the Q node, a second end of the MOS transistor N4 is electrically connected to a write bit line, and a gate of the MOS transistor N4 is electrically connected to the write word line. The foregoing circuit structure can implement effective writing, storage, and reading of data in the storage unit.

In a possible implementation, the storage unit includes a MOS transistor P1 and a MOS transistor N1 that are cascaded between the power supply and the ground, a MOS transistor P2 and a MOS transistor N2 that are cascaded between the power supply and the ground, a MOS transistor P3, a MOS transistor P4, a MOS transistor N5, and a MOS transistor N6. A first end of the MOS transistor P1 and a first end of the MOS transistor N1 are electrically connected to a Q node, and a first end of the MOS transistor P2 and a first end of the MOS transistor N2 are electrically connected to a QB node. Second ends of the MOS transistor P1 and the MOS transistor P2 are separately electrically connected to the power supply. The QB node is the data output end of the storage unit, and the QB node is a phase-inverted node of the Q node. A first end of the MOS transistor P3 is electrically connected to the Q node, a second end of the MOS transistor P3 is electrically connected to a write bit line, and a gate of the MOS transistor N3 is electrically connected to a write word line. A first end of the MOS transistor P4 is electrically connected to the QB node, a second end of the MOS transistor P4 is electrically connected to a write bit line, and a gate of the MOS transistor P4 is electrically connected to the write word line. A first end of the MOS transistor N5 is electrically connected to a second end of the MOS transistor N1, and a gate of the MOS transistor N5 is electrically connected to the write word line. A first end of the MOS transistor N6 is electrically connected to a second end of the MOS transistor N2, a gate of the MOS transistor N6 is electrically connected to the write word line, and second ends of the MOS transistor N5 and the MOS transistor N6 are separately electrically connected to the ground. The foregoing circuit structure can implement effective writing, storage, and reading of data in the storage unit.

In a possible implementation, the storage unit is a 6T storage unit.

In a possible implementation, the storage array further includes a half Schmitt inverter. An input end of the half Schmitt inverter is electrically connected to the read bit line, and an output end of the half Schmitt inverter is configured to output a phase-inverted signal in the read bit line. The read bit line performs phase inversion and output by using the half Schmitt inverter. Because the half Schmitt inverter has a lower switching threshold, a voltage that is on the read bit line and that meets a flip requirement is lower, thereby improving read performance of the entire storage array.

In a possible implementation, the half Schmitt inverter includes a MOS transistor P5, a MOS transistor P6, and a MOS transistor N7 that are cascaded between the power supply and the ground, and a MOS transistor P7. Gates of the MOS transistor P5, the MOS transistor P6, and the MOS transistor N7 are separately electrically connected to the read bit line. The MOS transistor P7 is electrically connected between a first node and the ground, and the first node is a connection point between the MOS transistor P5 and the MOS transistor P6. An output end of the half Schmitt inverter is separately electrically connected to a gate of the MOS transistor P7 and a second node, and the second node is a connection point between the MOS transistor P6 and the MOS transistor N7. Because the half Schmitt inverter has a lower switching threshold, a voltage that is on the read bit line and that meets a flip requirement is lower, thereby improving read performance of the entire storage array.

In a possible implementation, the read circuit includes a MOS transistor M1 and a MOS transistor M2 that are cascaded between the read bit line and the power supply, and at least one of the MOS transistor M1 and the MOS transistor M2 is a P-type MOS transistor. Because the PMOS transistor has a lower leakage current than the NMOS transistor, an electric leakage phenomenon in the electric leakage path can be suppressed.

According to a second aspect, an embodiment of this application provides a memory, including a decoder, an amplifier, and a storage array. The decoder is configured to decode a received address, and output a result obtained after the decoding to the storage array. The result obtained after the decoding includes an address used to control a read bit line switch, so that a storage unit that needs to be accessed in the storage array can be selected. The amplifier is configured to amplify data read from the storage array, and the storage array may be the storage array in any one of the first aspect and the possible implementations of the first aspect. The amplifier may be a sense amplifier (SA).

When an electric leakage path in a read circuit has a relatively high leakage current, and data in a storage unit is opposite to data in other storage units, a read bit line cannot keep at a correct level due to leakage currents of the other storage units, causing a data read error. In the storage array provided in this embodiment of this application, because there is at least one PMOS transistor in the electric leakage path, and the PMOS transistor has a lower leakage current than an NMOS transistor, a leakage current can be effectively suppressed, so that the read bit line can still keep at a correct level when the other storage units have leakage currents, thereby causing no impact on correct data reading. In addition, a lower leakage current enables more storage units to be mounted onto the read bit line in the storage array, thereby improving storage density of the storage array and reducing area overheads.

In a possible implementation, the memory further includes a word line driver, a time sequence controller, and an input/output driver. The word line driver is configured to control levels of a word line and a bit line based on a decoding result generated by the decoder, to implement access to a specified storage unit. The time sequence controller is configured to control a time sequence of the sense amplifier, and control the word line driver to drive the word line in the storage array. The input/output driver is configured to drive a transmission signal, for example, drive a received data signal and drive a data signal that needs to be sent, so that the data signals can be transmitted over long distances. The word line driver, the time sequence controller, and the input/output driver can improve data access efficiency in the memory.

According to a third aspect, an embodiment of this application provides a processor, including a logic circuit and a memory electrically connected to the logic circuit. The memory is the memory in the implementation of the second aspect.

According to a fourth aspect, an embodiment of this application provides an electronic device, including a processor, a bus, and a RAM. The bus is configured to implement communication between the RAM and the processor, and the processor is the processor in the implementation of the third aspect.

DESCRIPTION OF EMBODIMENTS

The following clearly describes the technical solutions in embodiments of this application with reference to the accompanying drawings in embodiments of this application.

The terms "first" and "second" in this application are merely intended for a purpose of description, and shall not be understood as an indication or implication of relative importance or implicit indication of a quantity of indicated technical features. Therefore, a feature limited by "first" or "second" may explicitly indicate or implicitly include one or more such features. In addition, the term "electrical connection" should be understood in a broad sense. For example, the "electrical connection" may be a physical direct connection, or may be an electrical connection implemented by using an intermediate medium, for example, a connection implemented by using a resistor, an inductor, or another electronic component.

For convenient description, in the embodiments of this application, any type of MOS transistor, such as a P-channel metal oxide semiconductor (PMOS) transistor or an N-channel metal oxide semiconductor (NMOS) transistor, is described by using a MOS transistor M0, a MOS transistor M1, a MOS transistor M2, or the like. In the embodiments of this application, different NMOS transistors are described by using a MOS transistor N1, a MOS transistor N2, a MOS transistor N3, and the like, and different PMOS transistors are described by using a MOS transistor P1, a MOS transistor P2, a MOS transistor P3, and the like. In the embodiments of this application, one electrode of a drain or a source of a MOS transistor is further referred to as a first end, and correspondingly, the other electrode is referred to as a second end.

Figure 2:
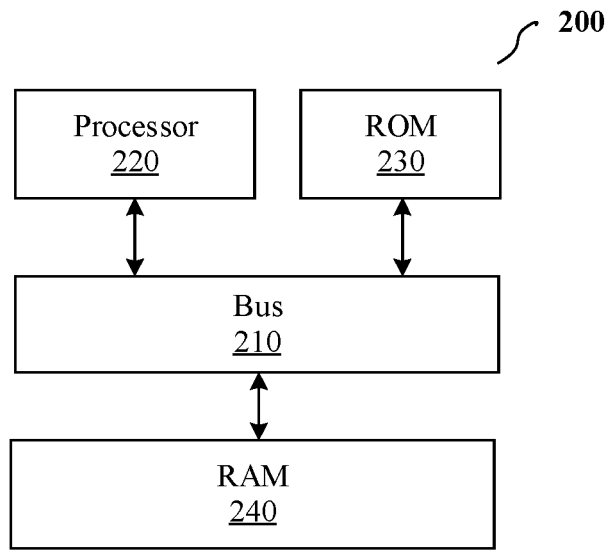
FIG. 2 is a schematic diagram of a structure of an electronic device.

FIG. 2 is a schematic diagram of a structure of an electronic device 200. The electronic device 200 may include a bus 210, and a processor 220, a read-only memory (ROM) 230, and a random access memory (RAM) 240 that are electrically connected to the bus 210. The bus 210 is configured to implement data transmission and control (communication) between the processor 220, the ROM 230, and the RAM 240. The bus 210 may be a bus of an Advanced eXtensible Interface (AXI) bus protocol, a peripheral component interconnect express (PCIE), or another bus protocol. The processor 220 is configured to implement data processing, such as calculation, compression, decompression, coding, or decoding. The processor 220 may be a central processing unit (CPU), a digital signal processor (DSP), an micro control unit (MCU), a microprocessor, or the like. The processor 220 may be disposed in an SoC or an application specific integrated circuit (ASIC), or may be an independent semiconductor chip. The ROM 230 is configured to store a fixed program or fixed data. The ROM 230 may be a programmable read-only memory (PROM), an erasable programmable read-only memory (EPROM), a flash memory, or the like. The RAM 240 is configured to store temporary data of a running program. The RAM 240 may be a static random access memory (SRAM), a dynamic random access memory (DRAM), or the like. In an implementation, the processor 220 may alternatively include a RAM, configured to store temporary data and implement a higher-rate read/write operation. The electronic device 200 may be a personal computer (PC), a server, or a workstation, or may be a terminal product, such as a mobile phone, a notebook computer, or a smart watch.

An embodiment of this application provides a memory. The memory may be the RAM 240 shown in FIG. 2, may be the RAM in the processor 220, or may be a RAM and a cache in another application scenario. In a possible implementation, the processor 220 may include a SRAM and a logic circuit. The logic circuit is configured to implement data calculation and scheduling. The memory may be used as a SRAM, to be used as a primary cache or a level 2 cache in the processor 220. In another possible implementation, the memory may be alternatively used as a register in a register file, or used in an ASIC or an field programmable gate array (FPGA) to implement data caching.

Figure 3:
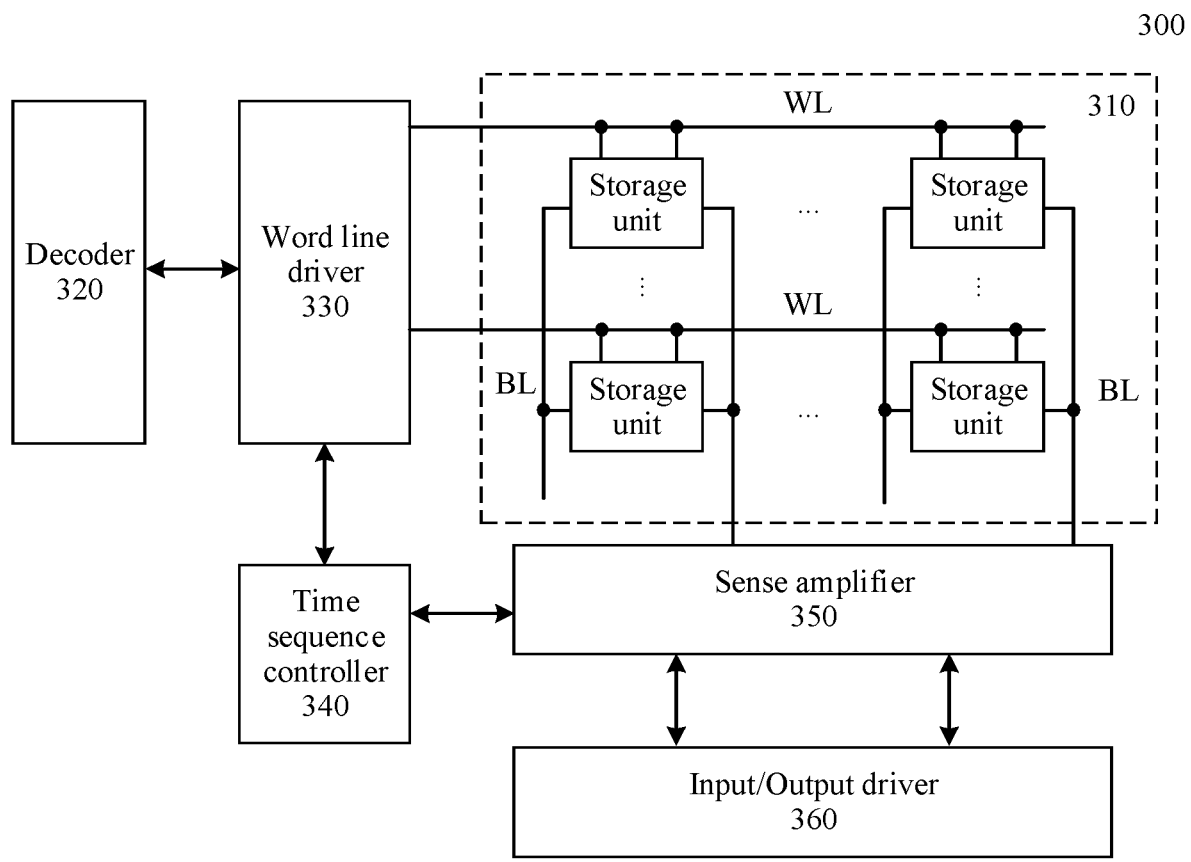
FIG. 3 is a schematic diagram of a structure of a memory according to an embodiment of this application.

FIG. 3 is a schematic diagram of a structure of a memory 300 according to an embodiment of this application. The memory 300 includes a storage array 310, a decoder 320, a word line driver 330, a time sequence controller 340, a sense amplifier (SA) 350, and an input/output driver 360. The storage array 310 includes a plurality of storage units. Each storage unit is configured to store 1-bit data. Each storage unit is electrically connected to a corresponding word line (WL) and bit line (BL). The WL and the BL are configured to select a unique storage unit, and perform a read or write operation on the storage unit. Specifically, the WL may include a read word line (RWL) and a write word line (WWL). Correspondingly, the BL may include a read bit line (RBL) and a write bit line (WBL). The read word line RWL and the read bit line RBL are configured to select a corresponding storage unit when data is read, and the write word line WWL and the write bit line WBL are configured to select a corresponding storage unit when data is written. The decoder 320 is configured to implement decoding of an address of a storage unit. The decoder 320 is configured to perform decoding based on a received address, to determine a storage unit that needs to be accessed. The word line driver 330 is configured to control levels of a word line WL and a bit line BL based on a decoding result generated by the decoder 320, to implement access to a specified storage unit. The sense amplifier 350 is configured to perform signal amplification on read data. The time sequence controller 340 is configured to control a time sequence of the sense amplifier 350, and control the word line driver 330 to drive the word line WL in the storage array 310. The input/output driver 360 is configured to drive a transmission signal, for example, drive a received data signal and drive a data signal that needs to be sent, so that the data signals can be transmitted over long distances. The storage array 310, the decoder 320, the word line driver 330, the time sequence controller 340, the sense amplifier 350, and the input/output driver 360 may be integrated into one chip, or may be separately integrated into a plurality of chips.

Figure 4:
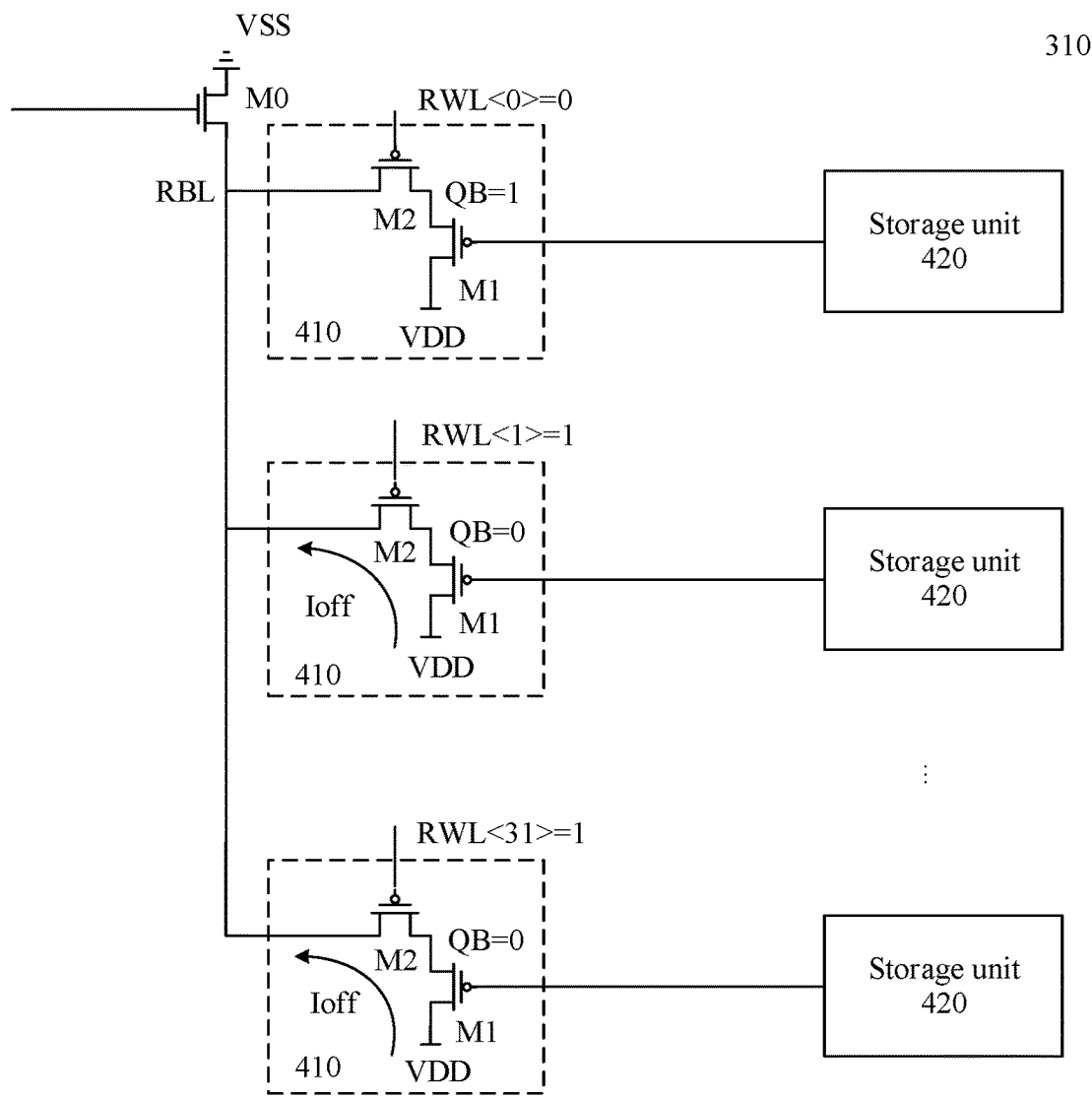
FIG. 4 shows a storage array according to an embodiment of this application.

FIG. 4 is an implementation of a storage array 310 according to an embodiment of this application. The storage array 310 includes a read bit line RBL, a read bit line switch M0 electrically connected between the read bit line RBL and a ground VSS, and a plurality of storage circuits mounted onto the read bit line RBL. Each storage circuit includes a read circuit 410 and a storage unit 420. Read circuits 410 may use a same circuit structure, or may use different circuit structures. Similarly, storage units 420 may also use a same circuit structure or different circuit structures. In the storage array 310 shown in FIG. 4, the read circuits 410 and the storage units 420 separately use a same circuit structure. A quantity of read circuits 410 mounted onto the read bit line RBL is the same as a quantity of storage units 420 mounted onto the read bit line RBL. For example, the quantity may be 32, 64, or 128. In this embodiment of this application, 32 read circuits 410 and 32 storage units 420 are used as an example. The storage array 310 may alternatively include a plurality of read bit lines RBLs, and the read bit lines are electrically connected to the ground VS S by using read bit line switches M0. The storage unit 420 is configured to store data, and the read circuit 410 is configured to read the data stored in the storage unit 420 and output the data to the read bit line RBL. The read circuit 410 has a data input end and a data output end. The data input end of the read circuit 410 is electrically connected to a data output end of the storage unit 420, and the data output end of the read circuit 410 is electrically connected to the read bit line RBL. The read circuit 410 is further electrically connected to a power supply VDD. The read circuit 410 has an electric leakage path from the power supply VDD to the read bit line RBL, and there is at least one PMOS transistor in the electric leakage path. In an implementation, each storage circuit includes a read word line RWL corresponding to the storage circuit, and the read circuit 410 may have a plurality of implementations. In the storage array 310 shown in FIG. 4, the read circuit 410 includes a MOS transistor M1 and a MOS transistor M2 that are cascaded between the read bit line RBL and the power supply VDD. A gate of the MOS transistor M1 is used as the data input end of the read circuit 410, to be electrically connected to the data output end of the storage unit 420, and the MOS transistor M1 is closed or open based on a data signal in the data output end of the storage unit 420. A drain and a source of the MOS transistor M1 are respectively electrically connected to the power supply VDD and the MOS transistor M2. For example, the drain of the MOS transistor M1 may be electrically connected to the power supply VDD, and the source of the MOS transistor M1 may be electrically connected to the MOS transistor M2; or the source of the MOS transistor M1 may be electrically connected to the power supply VDD, and the drain of the MOS transistor M1 may be electrically connected to the MOS transistor M2. A gate of the MOS transistor M2 is electrically connected to the read word line RWL, and the MOS transistor M2 is closed or open based on a level of the read word line RWL. One end of the MOS transistor M2 is used as the data output end of the read circuit 410, to be electrically connected to the read bit line RBL. Specifically, a drain and a source of the MOS transistor M2 are respectively electrically connected to the MOS transistor M1 and the read bit line RBL. For example, the drain of the MOS transistor M2 may be electrically connected to the read bit line RBL, and the source of the MOS transistor M2 may be electrically connected to the MOS transistor M1; or the source of the MOS transistor M2 may be electrically connected to the read bit line RBL, and the drain of the MOS transistor M2 may be electrically connected to the MOS transistor M1. In the read circuit shown in FIG. 4, the read bit line switch M0 is an NMOS transistor, and both the MOS transistor M1 and the MOS transistor M2 are PMOS transistors. The read circuit 410 shown in FIG. 4 is merely an example, and a specific circuit structure of the read circuit 410 is not limited in this embodiment of this application.

The read bit line switch M0 may be controlled, based on an address obtained after a decoder 320 performs decoding, to be closed or open. The read bit line switch M0 is configured to control a level of the read bit line RBL, to control data reading. Before data is read, the read bit line switch M0 keeps closed based on a control signal, and all read word lines RWLs are at an invalid level (1). In this case, the MOS transistor M2 is open, and the read bit line RBL is conducted with the ground VSS by using the read bit line switch M0 and is in a low level state. When data is read, for example, when data is read from the first storage unit 420 (a storage unit 420 corresponding to a read word line RWL<0>), the read bit line switch M0 is open based on a control signal, and a level on the read word line RWL<0> becomes a valid level (0) to select a corresponding read circuit 410, while other 31 read word lines RWL<1> to RWL<31> keep at the invalid level (1). The read circuit 410 reads data from a data output end QB of the first storage unit 420. When QB=1, the MOS transistor M1 is open, and in this case, the read bit line RBL still keeps at a low level, to indicate read data Q=0; or when QB=0, both the MOS transistor M1 and the MOS transistor M2 are closed, and the read bit line RBL is pulled by the power supply VDD to a high level, to indicate read data Q=1. Because the read word lines RWL<1> to RWL<31> corresponding to other 31 read circuits are all at the invalid level, a level on the read bit line RBL represents data in the storage unit 420 corresponding to the read circuit 410 that is selected by the read word line RWL<0>.

Each storage circuit in the storage array 310 still has an electric leakage path. The electric leakage path of the storage array 310 is shown as Ioff in FIG. 4. An electric leakage path of each read circuit 410 is from the power supply VDD, a MOS transistor M1, and a MOS transistor M2 to the read bit line RBL. A channel type of the PMOS transistor is a P type, a channel type of the NMOS transistor is an N type, and mobility of a hole carrier of a P-type channel is lower than mobility of an electronic carrier of an N-type channel, so that the PMOS transistor has a lower leakage current than the NMOS transistor, thereby effectively suppressing a leakage current of a data read path.

Figure 1:
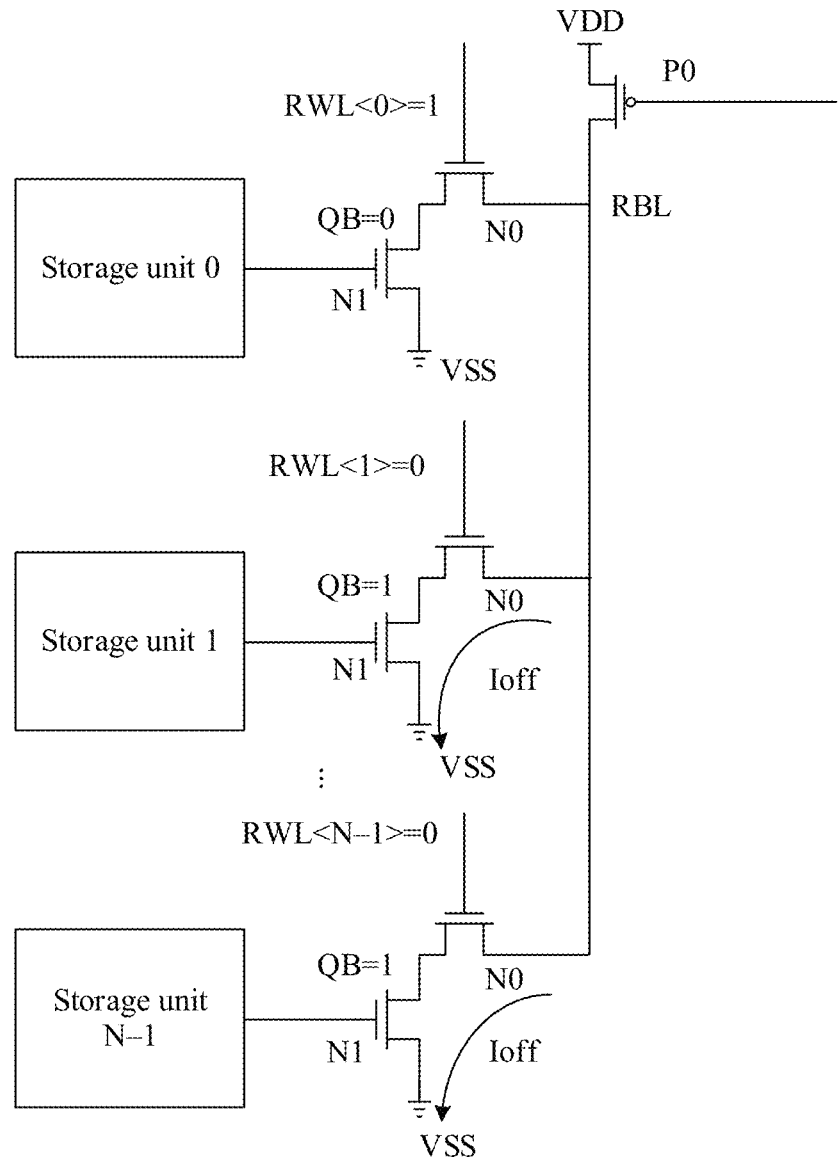
FIG. 1 is a schematic diagram of a structure of a SRAM in the conventional technology.

A leakage current suppression effect of the storage array 310 is described through comparison with an electric leakage status of a SRAM in FIG. 1. In the SRAM shown in FIG. 1, when data of a storage unit 0 is read, and the data of the storage unit 0 is QB=0 while data of other storage units 1 to N-1 is QB=1, a MOS transistor N1 corresponding to the storage unit 0 is open, a MOS transistor N0 corresponding to the storage unit 0 is closed, and the read bit line RBL should be at a high level 1 in a normal case. However, MOS transistors N0 and MOS transistors N1 between the other storage units 1 to N-1 and the read bit line RBL cause an electric leakage effect, and therefore the read bit line RBL cannot keep at the high level, and leakage currents Ioff flow from the read bit line RBL to the ground VSS through the MOS transistors N0 and the MOS transistors N1 as shown in FIG. 1. When more storage units are mounted onto the read bit line RBL, a higher leakage current Ioff is generated by the storage units, and therefore the read bit line RBL cannot keep at the high level in the foregoing case, and an error may occur in data read from the read bit line.

In the storage array 310 that is shown in FIG. 4 and that is provided in this embodiment of this application, when data of the first storage unit 420 (a storage unit 420 corresponding to a read word line RWL<0>) is read, and the data of the first storage unit is QB=1 while data of other storage units is QB=0, an MOS transistor M1 corresponding to the first storage unit is open, an MOS transistor M2 corresponding to the first storage unit is closed, and the read bit line RBL should be at a low level kept before reading in a normal case. Because of existence of the MOS transistor M1 and the MOS transistor M2, in read circuits 410 corresponding to the other storage units (storage units 420 corresponding to read word lines RWL<1> to RWL<31>), although leakage currents Ioff still exist on the power supply VDD→MOS transistors M1→MOS transistors M2→the read bit line RBL, electric leakage effects caused between the other storage units and the read bit line RBL should be suppressed by PMOS transistors at lower leakage currents, so that the read bit line RBL can still keep at a low level in the foregoing case, and no data read error occurs because a level cannot be kept due to existence of the leakage currents Ioff. Further, a lower leakage current Ioff enables more storage units to be mounted onto the read bit line RBL in the storage array 310, thereby improving storage density of the storage array 310 and reducing area overheads.

Figure 5:
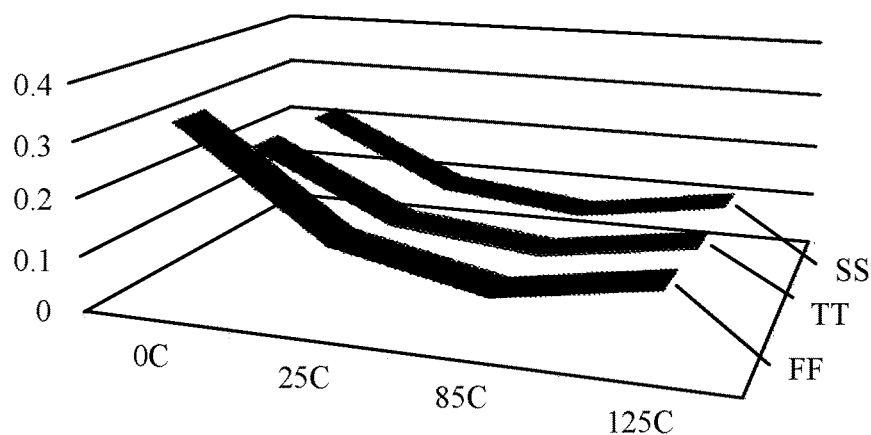
FIG. 5 is a schematic diagram of electric leakage statuses at different PVTs.

FIG. 5 is a schematic diagram of electric leakage statuses at different PVTs (process voltage temperature, process voltage temperature). A horizontal axis represents different temperatures. A vertical axis represents a relative leakage current that is of the storage array 310 and that is obtained after a leakage current in the SRAM shown in FIG. 1 is normalized. It can be learned from FIG. 5 that, in any one of an FF (fast fast) process corner, a TT (typical typical) process corner, or an SS (slow slow) process corner, a leakage current suppression effect of the storage array 310 is greatly improved compared with that in the conventional technology. The FF process corner has a best leakage current suppression effect, about 20%. In addition, a leakage current suppression effect gradually improves as a temperature rises. After a temperature exceeds 85° C., a leakage current suppression effect decreases to some degree, but is still better than that in the conventional technology (less than 1).

Figure 6:
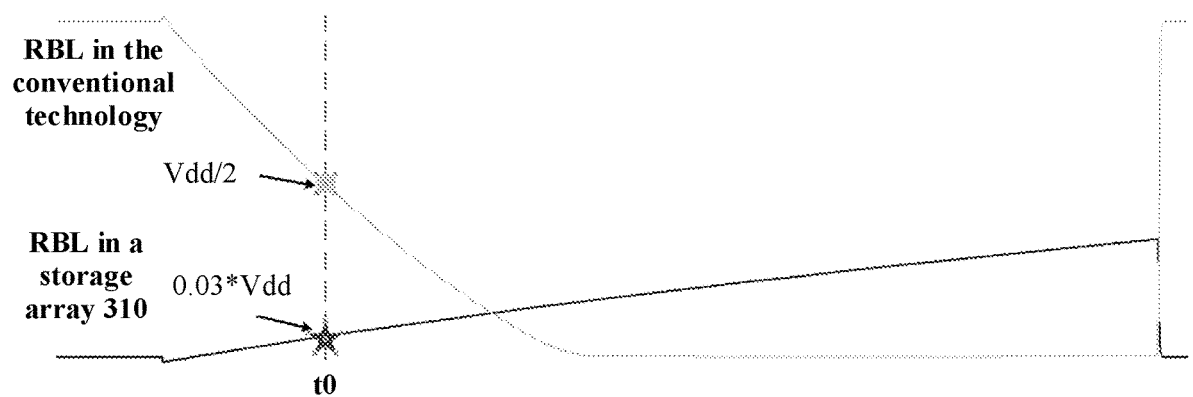
FIG. 6 shows level simulation results in different electric leakage scenarios.

FIG. 6 shows level simulation results of the read bit line (the RBL in the conventional technology) in the SRAM shown in FIG. 1 and the read bit line RBL in the storage array 310 provided in this embodiment of this application in an electric leakage scenario. For the RBL in the conventional technology, the electric leakage scenario means that when data of a storage unit 0 is read, and the data of the storage unit 0 is QB=0 while data of other storage units is QB=1, the read bit line RBL cannot keep at a high level, causing a data read error. For this embodiment of this application, the electric leakage scenario means that when data of the first storage unit is read, and the data of the first storage unit is QB=1 while data of other storage units is QB=0, the read bit line RBL can normally keep at a low level because of two cascaded PMOS transistors at low leakage currents, thereby causing no impact on correct data reading. It can be learned from FIG. 6 that, in a data reading process, because a level of the RBL in the conventional technology rapidly drops to Vdd/2 at a time point t0 due to a leakage current of the NMOS transistor, and finally drops to a level much lower than Vdd/2, a back-stage inverter is flipped, causing a data read error. In the read bit line RBL in the storage array 310 provided in this embodiment of this application, because of a low leakage current characteristic of the cascaded PMOS transistors, a level of the read bit line RBL rises to only 0.03*Vdd at the time point t0, and slowly rises to a level lower than Vdd/2 after same time. Because the level of the read bit line RBL in the storage array 310 finally does not exceed Vdd/2, a back-stage inverter is not flipped, thereby causing no impact on correct data reading.

In an implementation, the read bit line switch M0 in FIG. 4 is an NMOS switch. In another implementation, the read bit line switch M0 may be alternatively a PMOS switch. Compared with a read bit line switch of a PMOS transistor, the NMOS transistor has a lower conduction voltage drop than the PMOS transistor, and therefore is more controllable.

In an implementation, one PMOS transistor in the MOS transistor M1 and the MOS transistor M2 in the read circuit 410 may be replaced with an NMOS transistor. For example, the MOS transistor M1 is replaced with an NMOS transistor, and in this case, an N-type MOS transistor M1 is cascaded with a P-type MOS transistor M2. Because the PMOS transistor still exists in the electric leakage path, the read circuit 410 can still suppress a leakage current Ioff. Alternatively, the MOS transistor M2 is replaced with an NMOS transistor, and in this case, an N-type MOS transistor M2 is cascaded with a P-type MOS transistor M1. Because the PMOS transistor still exists in the electric leakage path, the read circuit 410 can still suppress a leakage current Ioff. Therefore, a leakage current Ioff can be suppressed if there is at least one PMOS transistor in the read circuit 410.

Figure 7:
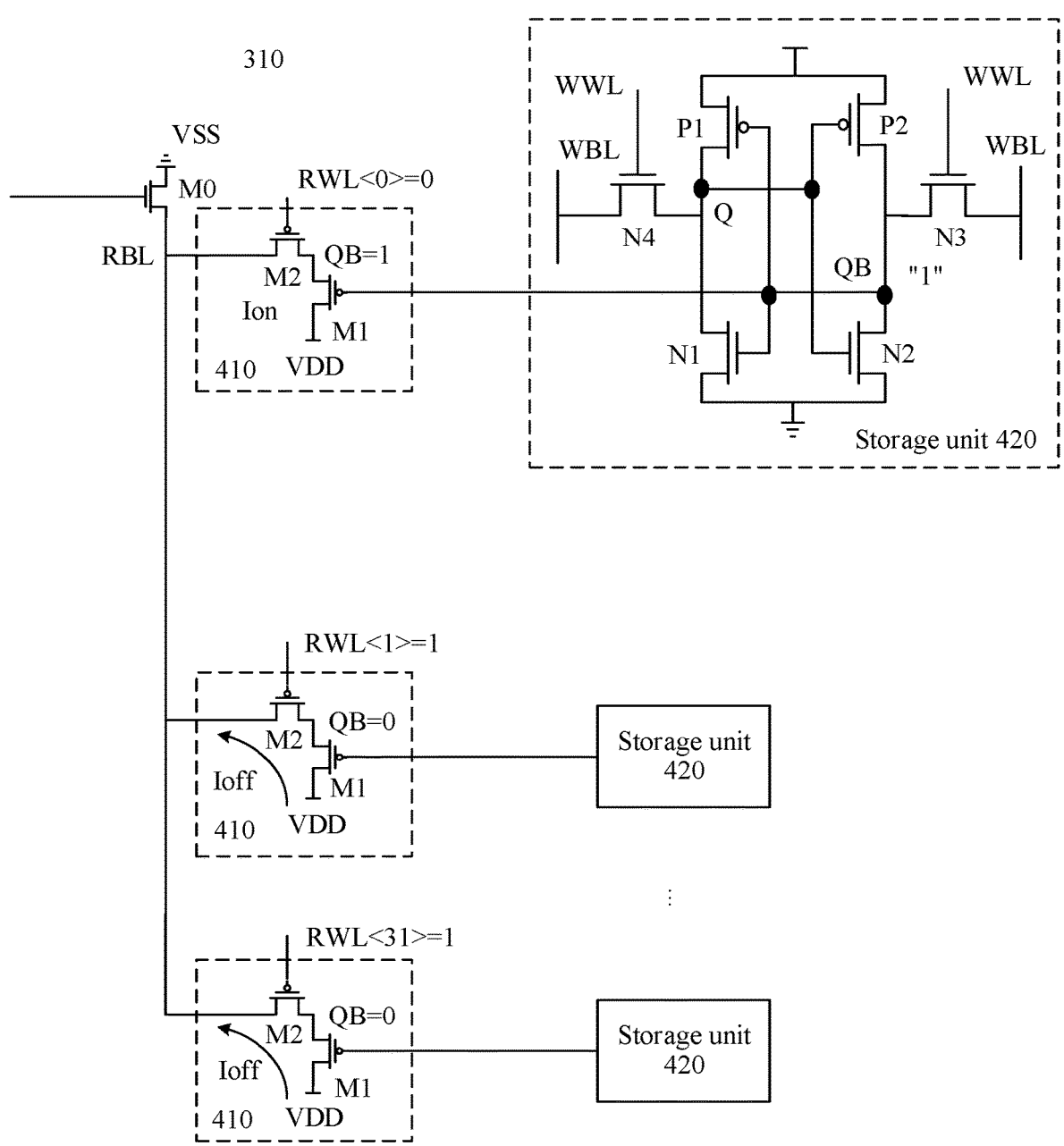
FIG. 7 is a diagram of a circuit structure of a specific storage array according to an embodiment of this application.

A specific structure of the storage unit 420 is not limited in this application. The storage unit 420 may be a storage unit of a common 6T (transistor) structure, a structure obtained through further improvement based on the 6T structure, or another structure in the conventional technology. FIG. 7 is a diagram of a circuit structure of a specific storage array 310 according to an embodiment of this application. The storage array 310 includes 6T storage units 420. In the storage array 310 shown in FIG. 7, an example in which two PMOS transistors are cascaded in a read circuit 410 and a read bit line switch M0 is an NMOS transistor is still used. In addition, the read circuit, and the read bit line switch M0 in the storage array 310 may alternatively use the foregoing implementations.

For convenient description, a source and a drain of a MOS transistor are replaced with a first end and a second end. For example, for the MOS transistor, the first end is the source, and the second end is the drain; or the first end is the drain, and the second end is the source. In the storage array 310 shown in FIG. 7, the storage unit 420 includes a MOS transistor P1, a MOS transistor N1, a MOS transistor P2, a MOS transistor N2, a MOS transistor N3, and a MOS transistor N4. The MOS transistor P1 is cascaded with the MOS transistor N1, and a first end of the MOS transistor P1 and a first end of the MOS transistor N1 are electrically connected to a Q node. A level of the Q node represents data stored in the storage unit 420. Correspondingly, the MOS transistor P2 is cascaded with the MOS transistor N2, and a first end of the MOS transistor P2 and a first end of the MOS transistor N2 are electrically connected to a QB node. A phase-inverted level of the QB node represents data stored in the storage unit 420. Both a gate of the MOS transistor P1 and a gate of the MOS transistor N1 are electrically connected to the QB node, and both a gate of the MOS transistor P2 and a gate of the MOS transistor N2 are electrically connected to the Q node. A second end of the MOS transistor P1 and a second end of the MOS transistor P2 are separately pulled up to a power supply voltage, and a second end of the MOS transistor N1 and a second end of the MOS transistor N2 are separately pulled down to a ground. In addition, for the MOS transistor N3, a first end is electrically connected to the QB node, a second end is electrically connected to a write bit line (WBL), and a gate is electrically connected to a write word line (WWL). For the MOS transistor N4, a first end is electrically connected to the Q node, a second end is electrically connected to a write bit line (WBL), and a gate is electrically connected to the write word line (WWL). In an implementation, the QB node is a data output end of the storage unit 420, and is electrically connected to an input end of the read circuit 410, namely, a gate of a MOS transistor M1.

The write word line WWL is configured to select a corresponding word when data is written in the storage unit 420, and the write bit line WBL is configured to write specific data in the storage unit 420. When the write word line WWL is at a valid level (1), both the MOS transistor N3 and the MOS transistor N4 are closed, and in this case, a level on the write bit line WBL is written in the storage unit 420. When the write word line WWL is at an invalid level (0), both the MOS transistor N3 and the MOS transistor N4 are open, and in this case, the storage unit 420 is in a locked state, and a level on the write bit line WBL may not affect levels of the Q node and the QB node.

Figure 8:
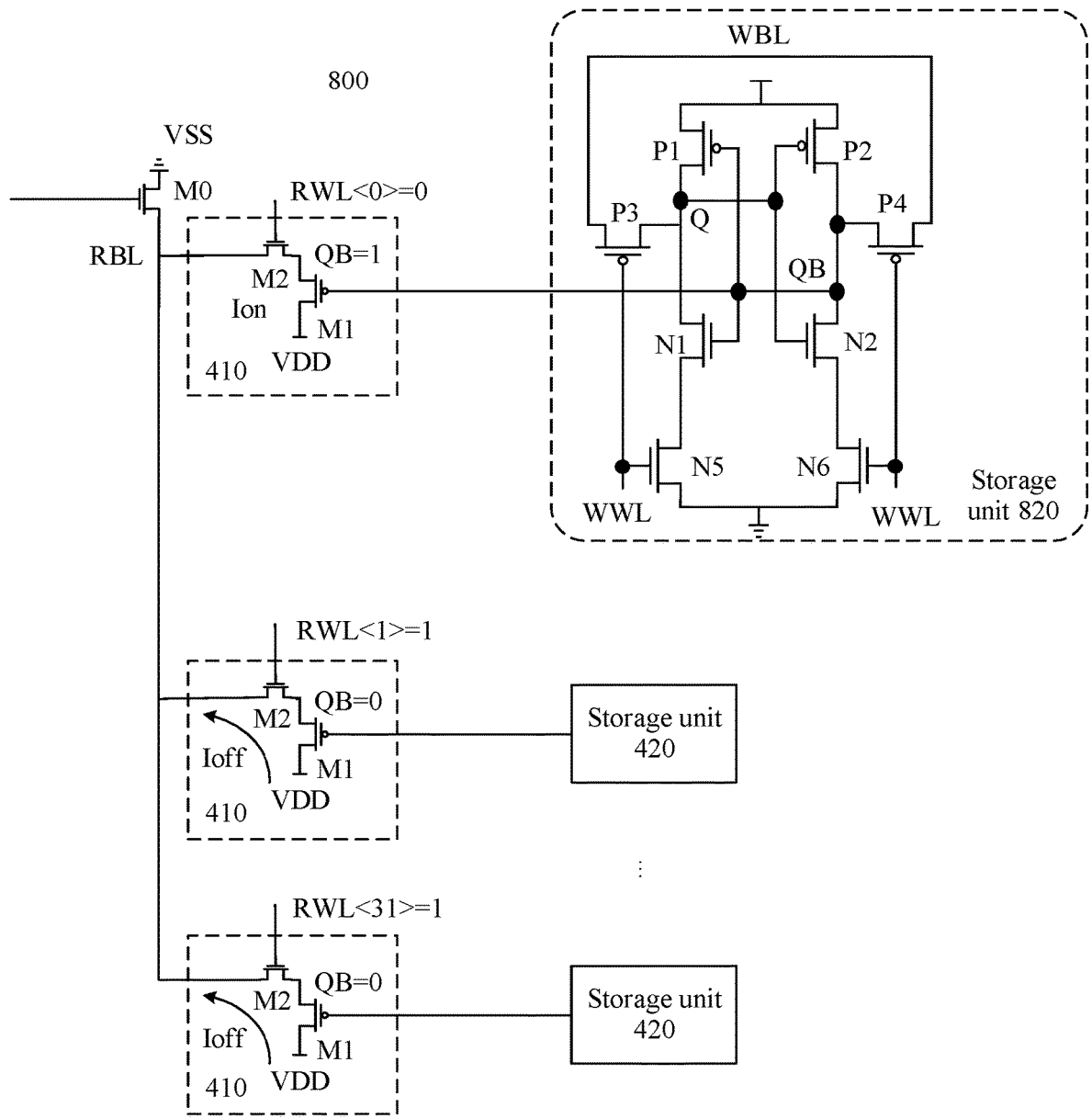
FIG. 8 is a diagram of a circuit structure of another specific storage array according to an embodiment of this application.

FIG. 8 is a diagram of a circuit structure of another specific storage array 800 according to an embodiment of this application. The storage array 800 includes 8T storage units 820. In the storage array 800 shown in FIG. 8, an example in which a P-type MOS transistor M1 is cascaded with an N-type MOS transistor M2 in a read circuit 810 and a read bit line switch M0 is an NMOS transistor is used. In addition, the read circuit and the read bit line switch M0 in the storage array 800 may alternatively separately use any one of the foregoing implementations.

A circuit structure of the storage unit 820 shown in FIG. 8 is similar to that of the storage unit 420 shown in FIG. 7, and same parts are not described again. A difference is that the storage unit 820 further includes a MOS transistor P3, a MOS transistor P4, a MOS transistor N5, and a MOS transistor N6. A first end of the MOS transistor P3 is electrically connected to the Q node, a second end of the MOS transistor P3 is electrically connected to a second end of the MOS transistor P4, and a first end of the MOS transistor P4 is electrically connected to the QB node. A gate of the MOS transistor P3 is electrically connected to a write word line WWL, and is electrically connected to a gate of the MOS transistor N5. A gate of the MOS transistor P4 is electrically connected to the write word line WWL, and is electrically connected to a gate of the MOS transistor N6. A first end of the MOS transistor N5 is electrically connected to a second end of the MOS transistor N1, a first end of the MOS transistor N6 is electrically connected to a second end of the MOS transistor N2, and both second ends of the MOS transistor N5 and the MOS transistor N6 are pulled down to the ground. An operating principle of the storage unit 820 is similar to that of the storage unit 420, and details are not described herein again.

An MOS transistor M2 in the read circuit 410 is replaced with the N-type MOS transistor. Because the P-type MOS transistor M1 still exists in an electric leakage path VDD→M1→M2→RBL, an electric leakage effect can be effectively suppressed.

Figure 9:
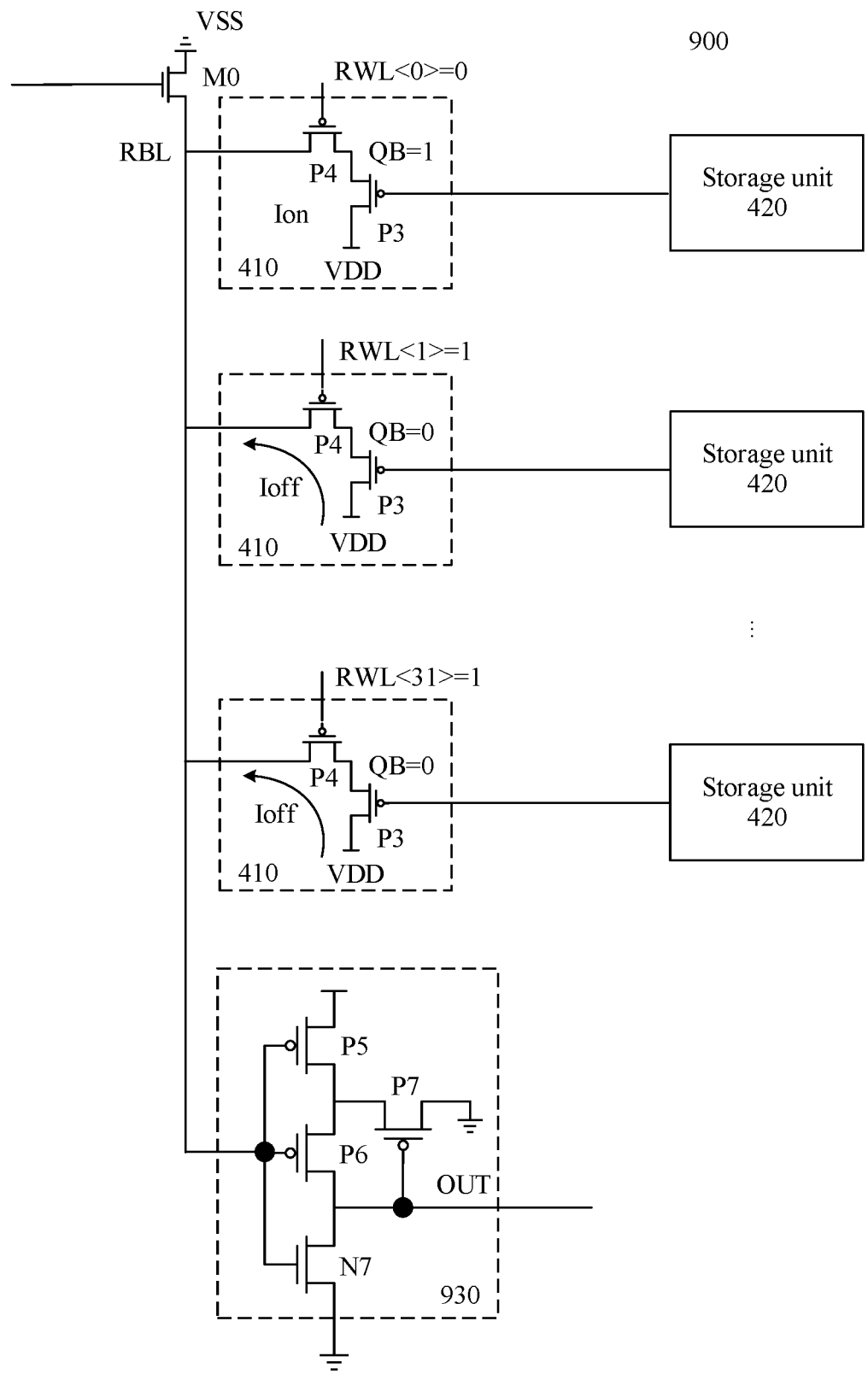
FIG. 9 is a diagram of a circuit structure of another storage array according to an embodiment of this application.

To further improve read performance of the storage array, this application further provides a storage array including a half Schmitt inverter. A circuit structure of the half Schmitt inverter may be a half structure of any type of Schmitt inverter. The half Schmitt inverter uses the read bit line RBL as an input and outputs a phase-inverted data signal. FIG. 9 is a diagram of a circuit structure of another storage array 900 according to an embodiment of this application. The storage array 900 is similar to the storage array 310, and same parts are not described again. A difference is that the storage array 900 further includes a half Schmitt inverter 930. The half Schmitt inverter 930 includes a MOS transistor P5, a MOS transistor P6, a MOS transistor N7, and a MOS transistor P7. The MOS transistor P5, the MOS transistor P6, and the MOS transistor N7 are cascaded between a power supply VDD and a ground VSS, and gates of the MOS transistor P5, the MOS transistor P6, and the MOS transistor N7 are all electrically connected to a read bit line RBL. A first end of the MOS transistor P7 is electrically connected to a connection point between the MOS transistor P5 and the MOS transistor P6, and a second end of the MOS transistor P7 is electrically connected to the ground VSS. A gate of the MOS transistor P7 is connected to a connection point between the MOS transistor P6 and the MOS transistor N7, and the connection point is an output point OUT of the half Schmitt inverter 930.

Figure 10:
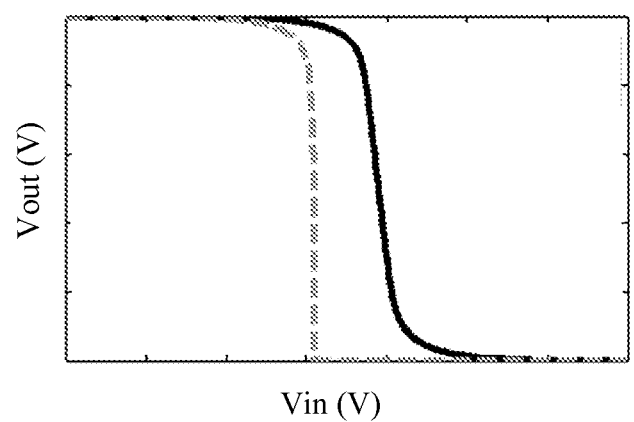
FIG. 10 is a graph of VTC curves of two types of phase inverters.

The half Schmitt inverter 930 can optimize read performance of the storage array 900. FIG. 10 is a graph of voltage-transfer characteristic (VTC) curves of two types of phase inverters. In the graph, a horizontal axis represents an input voltage Vin of a phase inverter, a vertical axis represents an output voltage Vout, a solid curve represents a VTC curve of a phase inverter electrically connected to a read bit line RBL in the conventional technology, and a dashed curve represents a VTC curve of the half Schmitt inverter 930 in the storage array 900. It can be learned from FIG. 10 that, as the input voltage Vin increases, in a process in which the output voltage Vout decreases, the dashed curve can reach a low level faster than the solid curve. This means that a switching threshold of the half Schmitt inverter 930 more inclines to a low level than a switching threshold of the phase inverter in the conventional technology. Because the half Schmitt inverter 930 has a lower switching threshold, a voltage that is on the read bit line RBL and that meets a flip requirement is lower, thereby improving read performance of the storage array 900.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A storage array, comprising:
   a read bit line;
   a read bit line switch, wherein the read bit line switch is coupled between a ground and the read bit line;
   a half Schmitt inverter having: an input end electrically connected to the read bit line, and an output end configured to output a phase-inverted signal in the read bit line; and
   a plurality of storage circuits, the plurality of storage circuits comprising a storage unit, a read circuit,
      wherein the storage unit is configured to store data,
      a data input end of the read circuit is electrically connected to a data output end of the storage unit, a data output end of the read circuit is electrically connected to the read bit line, the read circuit is further connected to a power supply, and the read circuit comprises at least one P-channel metal oxide semiconductor (PMOS) transistor in an electric leakage path of the read circuit from the power supply to the read bit line;
   wherein the half Schmitt inverter comprises:
      a metal oxide semiconductor (MOS) transistor P5, a MOS transistor P6, and a MOS transistor N7 that are cascaded between the power supply and the ground, wherein gates of the MOS transistor P5, the MOS transistor P6, and the MOS transistor N7 are separately electrically connected to the read bit line; and
      a MOS transistor P7, wherein the MOS transistor P7 is electrically connected between a first node and the ground, and the first node is a connection point between the MOS transistor P5 and the MOS transistor P6, the output end of the half Schmitt inverter is separately electrically connected to a gate of the MOS transistor P7 and a second node, and the second node is a connection point between the MOS transistor P6 and the MOS transistor N7.

2. The storage array according to claim 1, wherein each storage circuit further comprises a read word line corresponding to the storage circuit, and the read circuit comprises a MOS transistor M1 and a MOS transistor M2 that are cascaded between the read bit line and the power supply; and
   a gate of the MOS transistor M1 is the data input end of the read circuit, a gate of the MOS transistor M2 is electrically connected to the read word line, a first end of the MOS transistor M2 is the data output end of the read circuit, a second end of the MOS transistor M2 is electrically connected to a first end of the MOS transistor M1, a second end of the MOS transistor M1 is electrically connected to the power supply, and the MOS transistor M1 and the MOS transistor M2 comprise at least one PMOS transistor.

3. The storage array according to claim 2, wherein the MOS transistor M1 is a PMOS transistor, and the MOS transistor M2 is a PMOS transistor.

4. The storage array according to claim 1, wherein the read bit line switch is an NMOS transistor.

5. The storage array according to claim 1, wherein before data is read, the read bit line switch is closed, and when data is read from the storage unit, the read bit line switch is open;
   the MOS transistor M1 is closed or open based on data read from the storage unit; and
   when data is read from the storage unit, the MOS transistor M2 is closed based on the read word line.

6. The storage array according to claim 1, wherein the storage unit comprises:
   a MOS transistor P1 and a MOS transistor N1 that are cascaded between the power supply and the ground, wherein a first end of the MOS transistor P1 and a first end of the MOS transistor N1 are electrically connected to a Q node;
   a MOS transistor P2 and a MOS transistor N2 that are cascaded between the power supply and the ground, wherein a first end of the MOS transistor P2 and a first end of the MOS transistor N2 are electrically connected to a QB node, second ends of the MOS transistor P1 and the MOS transistor P2 are separately electrically connected to the power supply, second ends of the MOS transistor N1 and the MOS transistor N2 are separately electrically connected to the ground, the QB node is the data output end of the storage unit, and the QB node is a phase-inverted node of the Q node;

a MOS transistor N3, wherein a first end of the MOS transistor N3 is electrically connected to the QB node, a second end of the MOS transistor N3 is electrically connected to a first write bit line, and a gate of the MOS transistor N3 is electrically connected to a write word line; and a MOS transistor N4, wherein a first end of the MOS transistor N4 is electrically connected to the Q node, a second end of the MOS transistor N4 is electrically connected to a second write bit line, and a gate of the MOS transistor N4 is electrically connected to the write word line.

7. The storage array according to claim 1, wherein the storage unit comprises:

a MOS transistor P1 and a MOS transistor N1 that are cascaded between the power supply and the ground, wherein a first end of the MOS transistor P1 and a first end of the MOS transistor N1 are electrically connected to a Q node;

a MOS transistor P2 and a MOS transistor N2 that are cascaded between the power supply and the ground, wherein a first end of the MOS transistor P2 and a first end of the MOS transistor N2 are electrically connected to a QB node, second ends of the MOS transistor P1 and the MOS transistor P2 are separately electrically connected to the power supply, the QB node is the data output end of the storage unit, and the QB node is a phase-inverted node of the Q node;

a MOS transistor P3, wherein a first end of the MOS transistor P3 is electrically connected to the Q node, a second end of the MOS transistor P3 is electrically connected to a first write bit line, and a gate of the MOS transistor N3 is electrically connected to a write word line;

a MOS transistor P4, wherein a first end of the MOS transistor P4 is electrically connected to the QB node, a second end of the MOS transistor P4 is electrically connected to a second write bit line, and a gate of the MOS transistor P4 is electrically connected to the write word line;

a MOS transistor N5, wherein a first end of the MOS transistor N5 is electrically connected to a second end of the MOS transistor N1, and a gate of the MOS transistor N5 is electrically connected to the write word line; and a MOS transistor N6, wherein a first end of the MOS transistor N6 is electrically connected to a second end of the MOS transistor N2, a gate of the MOS transistor N6 is electrically connected to the write word line, and second ends of the MOS transistor N5 and the MOS transistor N6 are separately electrically connected to the ground.

8. A memory, comprising:

a storage array;

a decoder, configured to decode a received address, and output an address obtained after the decoding to the storage array; and an amplifier, configured to amplify data read from the storage array, wherein the storage array comprises:
 a read bit line;
 a read bit line switch, wherein the read bit line switch is connected between a ground and the read bit line;
 a half Schmitt inverter having an input end electrically connected to the read bit line, and an output end configured to output a phase-inverted signal in the read bit line; and
 a plurality of storage circuits, wherein each of the plurality of storage circuits comprises:
  a storage unit, wherein the storage unit is configured to store data; and
  a read circuit, wherein a data input end of the read circuit is electrically connected to a data output end of the storage unit, a data output end of the read circuit is electrically connected to the read bit line, the read circuit is further connected to a power supply, and the read circuit comprises:
   at least one P-channel metal oxide semiconductor (PMOS) transistor in an electric leakage path of the read circuit from the power supply to the read bit line;

wherein the half Schmitt inverter comprises:
 a metal oxide semiconductor (MOS) transistor P5, a MOS transistor P6, and a MOS transistor N7 that are cascaded between the power supply and the ground, wherein gates of the MOS transistor P5, the MOS transistor P6, and the MOS transistor N7 are separately electrically connected to the read bit line; and
 a MOS transistor P7, wherein the MOS transistor P7 is electrically connected between a first node and the ground, and the first node is a connection point between the MOS transistor P5 and the MOS transistor P6, the output end of the half Schmitt inverter is separately electrically connected to a gate of the MOS transistor P7 and a second node, and the second node is a connection point between the MOS transistor P6 and the MOS transistor N7.

9. The memory according to claim 8, wherein each storage circuit further comprises a read word line corresponding to the storage circuit, and the read circuit comprises a MOS transistor M1 and a MOS transistor M2 that are cascaded between the read bit line and the power supply; and a gate of the MOS transistor M1 is the data input end of the read circuit, a gate of the MOS transistor M2 is electrically connected to the read word line, a first end of the MOS transistor M2 is the data output end of the read circuit, a second end of the MOS transistor M2 is electrically connected to a first end of the MOS transistor M1, a second end of the MOS transistor M1 is electrically connected to the power supply, and the MOS transistor M1 and the MOS transistor M2 comprise at least one PMOS transistor.

10. The memory according to claim 9, wherein the MOS transistor M1 is a PMOS transistor, and the MOS transistor M2 is a PMOS transistor.

11. The memory according to claim 8, wherein the read bit line switch is an NMOS transistor.

12. The memory according to claim 8, wherein before data is read, the read bit line switch is closed, and when data is read from the storage unit, the read bit line switch is open.

13. An electronic device, comprising:

a processor, a random access memory (RAM), and a bus;

wherein the processor comprises a read bit line, a read bit line switch, a half Schmitt inverter and a plurality of storage circuits, wherein the read bit line switch is connected between a ground and the read bit line, wherein each of the plurality of storage circuits comprises: a storage unit and a read circuit, wherein the storage unit is configured to store data, wherein a data input end of the read circuit is electrically connected to a data output end of the storage unit, a data output end of the read circuit is electrically connected to the read bit line, the read circuit is further connected to a power supply, and the read circuit comprises: at least one P-channel metal oxide semiconductor (PMOS) transistor in an electric leakage path of the read circuit from the power supply to the read bit line;

wherein the half Schmitt inverter comprises:
an input end electrically connected to the read bit line;
an output end configured to output a phase-inverted signal in the read bit line;
a metal oxide semiconductor (MOS) transistor P5, a MOS transistor P6, and a MOS transistor N7 that are cascaded between the power supply and the ground, wherein gates of the MOS transistor P5, the MOS transistor P6, and the MOS transistor N7 are separately electrically connected to the read bit line; and
a MOS transistor P7 electrically connected between a first node and the ground, wherein the first node is a connection point between the MOS transistor P5 and the MOS transistor P6, the output end of the half Schmitt inverter is separately electrically connected to a gate of the MOS transistor P7 and a second node, and the second node is a connection point between the MOS transistor P6 and the MOS transistor N7.

14. The electronic device according to claim 13, wherein each storage circuit further comprises a read word line corresponding to the storage circuit, and the read circuit comprises a MOS transistor M1 and a MOS transistor M2 that are cascaded between the read bit line and the power supply; and a gate of the MOS transistor M1 is the data input end of the read circuit, a gate of the MOS transistor M2 is electrically connected to the read word line, a first end of the MOS transistor M2 is the data output end of the read circuit, a second end of the MOS transistor M2 is electrically connected to a first end of the MOS transistor M1, a second end of the MOS transistor M1 is electrically connected to the power supply, and the MOS transistor M1 and the MOS transistor M2 comprise at least one PMOS transistor.

15. The electronic device according to claim 14, wherein the MOS transistor M1 is a PMOS transistor, and the MOS transistor M2 is a PMOS transistor.

16. The electronic device according to claim 13, wherein the read bit line switch is an N-channel metal oxide semiconductor (NMOS) transistor.

17. The electronic device according to claim 13, wherein before data is read, the read bit line switch is closed, and when data is read from the storage unit, the read bit line switch is open.

* * * * *